US008729920B2

(12) United States Patent
Graas et al.

(10) Patent No.: US 8,729,920 B2
(45) Date of Patent: May 20, 2014

(54) CIRCUIT AND METHOD FOR RAS-ENABLED AND SELF-REGULATED FREQUENCY AND DELAY SENSOR

(75) Inventors: Carole D. Graas, Jericho, VT (US); Keith A. Jenkins, Sleepy Hollow, NY (US); Pascal A. Nsame, Essex Junction, VT (US); Kevin G. Stawiasz, Bethel, CT (US)

(73) Assignee: International Business Machines Corporation, Armonk, NY (US)

( * ) Notice: Subject to any disclaimer, the term of this patent is extended or adjusted under 35 U.S.C. 154(b) by 621 days.

(21) Appl. No.: 12/953,828

(22) Filed: Nov. 24, 2010

(65) Prior Publication Data

US 2012/0126870 A1    May 24, 2012

(51) Int. Cl.
*G01R 31/26* (2014.01)
(52) U.S. Cl.
USPC ............ 324/762.02; 324/762.01; 331/44
(58) Field of Classification Search
USPC .................................. 324/762.02
See application file for complete search history.

(56) References Cited

U.S. PATENT DOCUMENTS

| 6,515,549 | B2 * | 2/2003 | Nakano ............. 331/57 |
| 6,731,179 | B2 | 5/2004 | Abadeer et al. |
| 6,933,731 | B2 | 8/2005 | Reddy et al. |
| 7,129,800 | B2 | 10/2006 | Gauthier et al. |
| 7,164,264 | B2 | 1/2007 | Anderson et al. |
| 7,205,854 | B2 | 4/2007 | Liu |
| 7,345,460 | B2 | 3/2008 | Ma et al. |
| 7,495,519 | B2 | 2/2009 | Kim et al. |
| 2008/0253437 | A1 | 10/2008 | Kim et al. |
| 2009/0063061 | A1 | 3/2009 | Bolam et al. |
| 2011/0078506 | A1 | 3/2011 | Graas et al. |

FOREIGN PATENT DOCUMENTS

EP     1398639 A2    3/2004

OTHER PUBLICATIONS

Oner et al., "A Compact Monitoring Circuit for Real-Time On-Chip Diagnosis of Hot-Carrier Induced Degradation", IEEE, Mar. 1997, vol. 10, pp. 72-76.

* cited by examiner

*Primary Examiner* — Arleen M Vazquez
*Assistant Examiner* — Feba Pothen
(74) *Attorney, Agent, or Firm* — David Cain; Roberts Mlotkowski Safran & Cole, P.C.

(57) ABSTRACT

Circuits and methods are provided for a reliability, availability and serviceability (RAS) enabled and self-regulated frequency and delay sensor of a semiconductor. A circuit for measuring and compensating for time-dependent performance degradation of an integrated circuit, includes at least one critical functional path of the integrated circuit, and Wearout Isolation Registers (WIR's) connected to boundaries of the critical functional path. The circuit also includes a feedback path connected to the WIR's, and a sensor control module operable to disconnect the critical functional path from preceding and succeeding functional paths of the integrated circuit, connect the critical functional path to the feedback path to form a critical path ring oscillator (CPRO), and enable the CPRO to generate an operating signal. A delay sensor module is operable to measure a frequency of the operating signal to determine and compensate for a degradation of application performance over a lifetime of a semiconductor product.

21 Claims, 5 Drawing Sheets

CIRCUIT AND METHOD FOR RAS-ENABLED AND SELF-REGULATED FREQUENCY AND DELAY SENSOR

FIELD OF THE INVENTION

The invention relates to semiconductors and, more particularly, to a circuit and a method for a reliability, availability and serviceability (RAS) enabled and self-regulated frequency and delay sensor of a semiconductor.

BACKGROUND

The introduction of nanometer technologies has enabled products integrating multi-core processors, hybrid accelerators, and large static random access memory (SRAM), ternary content-addressable memory (TCAM), and/or embedded dynamic random access memory (eDRAM) content. These nanometer-enabled semiconductor products may render traditional measurement methods based on device-level solutions insufficient to achieve the level of reliability, availability and serviceability (RAS) required of these products. For example, measurement methods for current RAS features may include a technique for measuring a degradation of a maximum operating frequency of a semiconductor product to detect and avoid system faults. These methods may include mimicking a functional path of the semiconductor and measuring the frequency of a signal correlated to the mimicked functional path. Alternative methods may include using specific functional patterns to derive the application performance of the semiconductor product.

Furthermore, traditional methods have limited accuracy for application operating above 1 GHz. For instance, mimicking a functional path of a semiconductor requires complex and unpredictable estimations of numerous specifications related to the actual functional path resulting in significant performance and area overhead during normal operation of a functional path.

Accordingly, there exists a need in the art to overcome the deficiencies and limitations described hereinabove.

SUMMARY

In a first aspect of the invention, a circuit for measuring and compensating for time-dependent performance degradation of an integrated circuit, includes at least one critical functional path of the integrated circuit, and Wearout Isolation Registers (WIR's) connected to boundaries of the critical functional path. The circuit also includes a feedback path connected to the WIR's, and a sensor control module operable to disconnect the critical functional path from preceding and succeeding functional paths of the integrated circuit, connect the critical functional path to the feedback path to form a critical path ring oscillator (CPRO), and enable the CPRO to generate an operating signal. A delay sensor module is operable to measure a frequency of the operating signal to determine and compensate for a degradation of application performance over a lifetime of a semiconductor product.

In another aspect of the invention, a method for measuring and compensating for time-dependent application performance degradation of an integrated circuit includes disconnecting a critical functional path of the integrated circuit from preceding and succeeding functional paths of the integrated circuit, and connecting the critical functional path to a feedback path to form a critical path ring oscillator (CPRO). The method also includes enabling the CPRO to generate an operating signal. A frequency of the operating signal is measured to determine and compensate for a degradation of the frequency of the operating signal over a lifetime of a semiconductor product.

In yet another aspect of the invention, a computer program product comprising a computer usable storage medium having readable program code embodied in the storage medium, the computer program product includes at least one component operable to disconnect a critical functional path from preceding and succeeding functional paths of the integrated circuit. The component is further operable to connect the critical functional path to a feedback path to form a critical path ring oscillator (CPRO), enable the CPRO to generate an operating signal, generate a reference performance ring oscillator (RPRO) signal, receive the CPRO operating signal, and send the CPRO operating signal and the RPRO signal for measurement. A frequency of the CPRO operating signal and an initial frequency of the CPRO operating signal are measured to determine and compensate for a time-dependent degradation of the frequency of the CPRO operating signal.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductors and, more particularly, to a circuit and a method for a reliability, availability and serviceability (RAS) enabled and self-regulated frequency and delay sensor of a semiconductor or integrated circuit. More specifically, the invention is directed to a frequency and delay sensor ("Adaptive Wearout Sensor (AWS)") of a semiconductor. The AWS configures, measures, monitors, and compensates for shifts in a maximum operating frequency of the semiconductor based on actual performance of at least one functional path of the semiconductor.

In implementation, the AWS configures the functional path during a performance evaluation mode via disconnecting the functional path from preceding and succeeding paths of the semiconductor or other semiconductors, and connecting the functional path to a feedback path of the AWS. The functional path and the feedback path form a ring oscillator that is enabled with a programmable control signal, and a ring oscillator signal corresponds to the actual performance of the functional path. A ring oscillator frequency is a function of the functional path topology, and is modulated by fail modes associated with the degradation in performance of the target functional path. Consecutive measurements of the ring oscillator signal and a reference technology-specific oscillating signal are then compared to a maximum operating frequency of the target functional path to measure and monitor for a rate of shift in performance. If an unexpected shift in performance is determined, the AWS may initiate a process of compensating for the shift in application performance of the target functional path.

Advantageously, the invention provides an in-system, self-testing macro for monitoring and compensating for shifts in a maximum operating frequency of a semiconductor, without requiring extensive development including expensive test equipment and lab infrastructure. Also, the AWS measures frequencies of actual functional paths of a semiconductor, instead of mimicking these functional paths and measuring frequencies of these mimicked functional paths, which may be less accurate. The frequencies of actual functional paths of the semiconductor are more-targeted product metrics for semiconductor qualification (e.g., application, technology, and design) purposes than the frequencies of mimicked functional paths. Knowing the frequencies of actual function paths further accelerate determination of root cause of problems in semiconductors during field tests.

In addition, the invention does not have to rely on derivations of the application performance to determine the operating frequency of the semiconductor. As a result, the invention does not require measuring frequency by derivation of application performance, which may be expensive and less accurate. Moreover, the invention enables in-system RAS features of a semiconductor, such as detecting and avoiding time-dependent system faults.

Figure 1A:
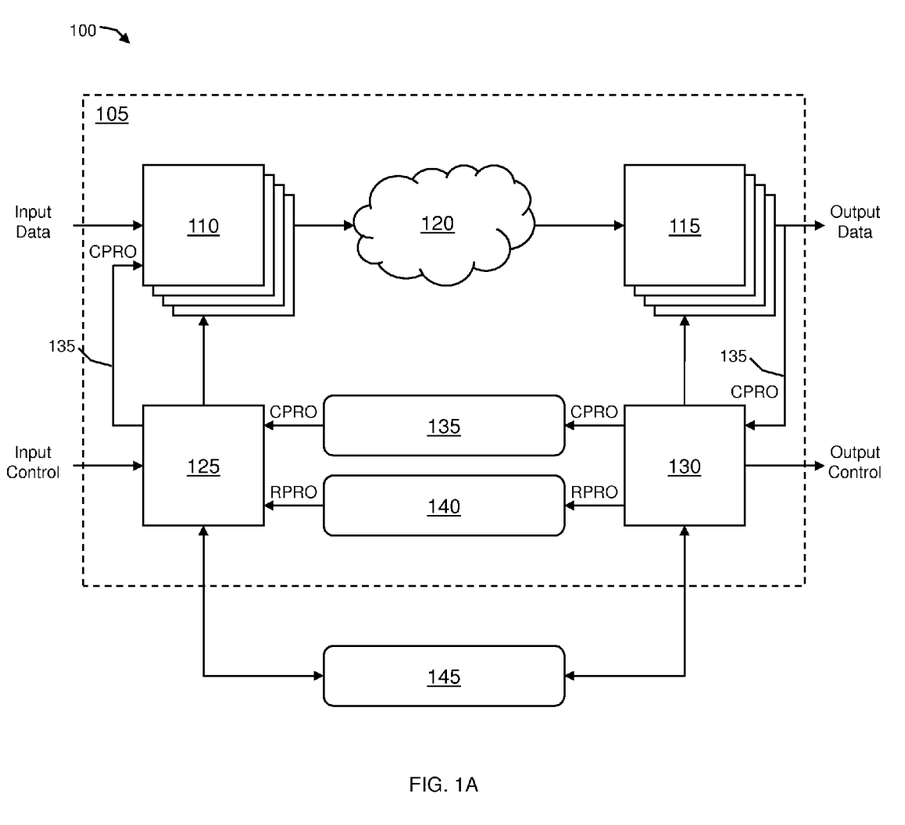
FIG. 1A is an exemplary schematic of a circuit for a frequency and delay sensor ("Adaptive Wearout Sensor (AWS)") of a semiconductor in accordance with aspects of the invention.

FIG. 1A is an exemplary schematic of a circuit 100 for an AWS 105 of a semiconductor in accordance with aspects of the invention. The AWS 105 is designed to minimize performance and area overhead during normal operation of semiconductor datapaths to be measured. Specifically, the AWS 105 includes at least one inbound Wearout Isolation Register ("WIR") 110 and at least one outbound WIR 115 that replace master or slave latches typically found at and connected to boundaries (e.g., ends) of at least one user-defined functional datapath ("critical path") 120 of the semiconductor. In embodiments, the inbound and outbound WIR's 110, 115 may include a combination of muxes and existing registers in the target critical path. In embodiments, the critical path 120 may include front-end-of-the-line (FEOL) and/or back-end-of-the-line (BEOL) functional elements in a given semiconductor node.

During normal operation of the critical path 120, input data is transferred from, for example, other semiconductor datapaths, other semiconductor components, and/or other semiconductors into the inbound WIR 110. The input data is then stored in the inbound WIR 110, transferred through the critical path 120 into the outbound WIR 115, and stored in the outbound WIR 115. The outbound WIR 115 then outputs the stored data as output data to, for instance, other semiconductor components and/or other semiconductors.

The AWS 105 further includes an inbound control module 125, an outbound control module 130, a user-defined feedback path 135, and a reference performance ring oscillator (RPRO) 140. In embodiments, the inbound and the outbound control modules 125, 130 and the RPRO 140 may be implemented in a separate processor, component, and/or computer program product from the critical path 120 and the feedback path 135. The feedback path 135 may be implemented as part of an application-specific integrated circuit on the semiconductor product.

The inbound control module 125 and the outbound control module 130 of the AWS 105 are in communication (e.g., interface) with a delay sensor module 145 that may be implemented as a separate processor, component, and/or computer program product from the AWS 105. In embodiments, other semiconductor components and/or other semiconductors (e.g., another processor) may initiate (and terminate) a performance evaluation mode of the AWS 105 via transferring into the inbound control module 125 an input control signal that indicates initiation (or termination) of the evaluation mode. In embodiments, the delay sensor module 145 may initiate (and terminate) the evaluation mode via transferring control signals into the inbound and the outbound control modules 125, 130.

During its performance evaluation mode, the AWS 105 configures one critical path 120 for performance evaluation (e.g., operating frequency measurements and monitoring), measures and monitors an operating frequency of the critical path 120, and compensates for shifts in performance. To perform these functions, the inbound control module 125 disconnects the critical path 120 from a preceding datapath Likewise, the outbound control module 130 disconnects the critical path 120 from a succeeding datapath. The inbound and the outband control modules 125, 130 then connect the critical path 120 to the feedback path 135 to form a critical path ring oscillator ("CPRO").

In embodiments, the critical path 120 and the feedback path 135 form the CPRO since the feedback path 135 may include, for example, at least one inverter, where an output signal of the inverter is fed through the critical path 120 and back into an input of the inverter. In embodiments, if the feedback path 135 includes more than one inverter such that a total number of inverters in the CPRO is an odd number, then the feedback inverters are attached in a daisy chain, where an output signal of a last inverter is fed through the critical path 120 and back into an input of a first inverter. These structures cause an output signal of at least one gate (e.g., the at least one inverter) in the feedback path 135 to oscillate between two voltage levels. Accordingly, the critical path 120 is susceptible to time-dependent performance degradation.

Once the CPRO is formed, the outbound control module 130 enables the CPRO by applying an initial voltage to the feedback path 135. A resulting CPRO signal is fed through the at least one gate of the feedback path 135, which causes the CPRO signal to oscillate, and then fed through the feedback path 135 (which also goes through the inbound control module 125 and the inbound WIR 110) and into the critical path 120. Here, a frequency of the CPRO signal may be changed due to a degradation of the operating frequency of the critical path 120. Accordingly, the CPRO signal is an oscillating signal initially-enabled with a maximum operating frequency of the critical path 120, but the frequency of the CPRO signal may be degraded due to the critical path 120. Thus, the CPRO signal is used to determine an actual performance of the critical path 120. The CPRO signal is fed through the critical path 120 and the outbound WIR 115 and back into the feedback path 135 (which also goes through the outbound control module 130).

At the same time after the CPRO is formed, the outbound control module 130 further enables the RPRO 140 by applying the same initial voltage to the RPRO 140 and thus, generating a RPRO signal. In embodiments, the RPRO 140 may include, for example, at least one inverter, where an output signal of the inverter is fed back into an input of the inverter. In embodiments, if the RPRO 140 includes more than one inverter, then the RPRO 140 includes an odd number of inverters attached in a daisy chain, where an output signal of a last inverter is fed back into an input of a first inverter. These structures cause an output signal of at least one gate (e.g., the at least one inverter) in the RPRO 140 to oscillate between two voltage levels.

The RPRO signal is an oscillating signal with a predetermined and constant frequency, and the RPRO signal is used as a reference of a maximum operation frequency for a target semiconductor technology. The RPRO signal is fed through the RPRO 140 and into the inbound control module 125.

In embodiments, at predetermined times, the inbound control module 125 may receive the CPRO and RPRO signals and send these signals to the delay sensor module 145 for measurement. At predetermined times, the outbound control module 130 may receive the CPRO signal and send this signal to the delay sensor module 145 for measurement. For example, the delay sensor module 145 may receive and measure the frequencies of the CPRO and the RPRO signals at least two subsequent times: 1) when the feedback path 135 and the RPRO 140 are enabled or powered on at time $t_0$, and 2) when the feedback path 135 and the critical path 120 are connected at least once at time $t_n$. In embodiments, the delay sensor module 145 may receive and measure (e.g., monitor) the frequencies of the CPRO and the RPRO signals at a number of predetermined times until the performance evaluation mode is complete.

In embodiments, the delay sensor module 145 may use the measured frequency data to compare the potentially-degraded actual operating frequency of the critical path 120 (via received CPRO signals) at time $t_n$ to an initial maximum operating frequency of the critical path 120 at time $t_0$. The delay sensor module 145 may determine that there is a time-dependent degradation of the application performance of the critical path 120 if the actual operating frequency of the critical path 120 is less than the initial maximum operating frequency of the critical path 120 over time. Based on this determination of the degradation of the operating frequency of the critical path 120 over time, the delay sensor module 145 may estimate eminent failure of the critical path 120, and detect a failure of the critical path 120. In embodiments, the delay sensor module 145 may detect various types of failures of the critical path 120 pertaining to operating frequency degradation or shifts over time. These failures may include, for instance, negative bias temperature instability (NBTI), positive bias temperature instability (PBTI), hot carriers injection (HCI), time-dependent dielectric breakdown (TDDB), and electromigration (EM). NBTI and PBTI affect pMOS and nMOS devices, respectively, and include unwanted changes in threshold voltages of the devices, and thus, in currents and transconductances of the devices. HCI is when charge carriers in a semiconductor gain enough potential energy to overcome barriers and migrate to a different area of the semiconductor. TDDB is when a gate oxide of a semiconductor breaks down due to an application of an electric field. EM is when material in a semiconductor is transported by the gradual movement of ions in a conductor due to the momentum transfer between conducting electrons and diffusing metal atoms.

After estimating the eminent failure of the critical path 120, and/or detecting the failure of the critical path 120, the delay sensor module 145 may initiate a process to compensate for the eminent failure and/or the failure of the critical path 120. For example, the delay sensor module 145 may be in communication with other semiconductor components and/or other semiconductors in the system, and may command and/or recommend them to perform an action to compensate for the eminent failure and/or the failure of the critical path 120 (e.g., avoid sending data to the degraded critical path 120). The delay sensor module 145 may also generate and send a signal to these components indicating the degradation of the operating frequency of the critical path 120. The functions of the delay sensor module 145 may be implemented in software loaded onto, for example, a processor and/or a memory of the delay sensor module 145.

In embodiments, the outbound control module 130 may be in communication with other semiconductor components and/or other semiconductors in the system and may transfer an output control signal to these elements. For example, the output control signal may include a command and/or recommendation generated by the delay sensor module 145 to perform an action to compensate for the failure of the critical path 120. The output control signal may include the signal generated by the delay sensor module 145 indicating the degradation of the operating frequency of the critical path 120.

Advantageously, the AWS 105 configures, measures, monitors, and compensates for shifts in the maximum operating frequency of the semiconductor based on actual performance of the critical path 120 of the semiconductor, instead of mimicked performance of the critical path 120 or measuring frequency by derivation from application performance of the semiconductor. Furthermore, the AWS 105 may enable in-system Reliability, Availability, and Serviceability (RAS) features of the semiconductor, such as detecting and avoiding system faults due to the critical path 120 degrading until it is non-functional. Accordingly, the AWS 105 is used to prevent and recover from integrated circuit failure.

Figure 1B:
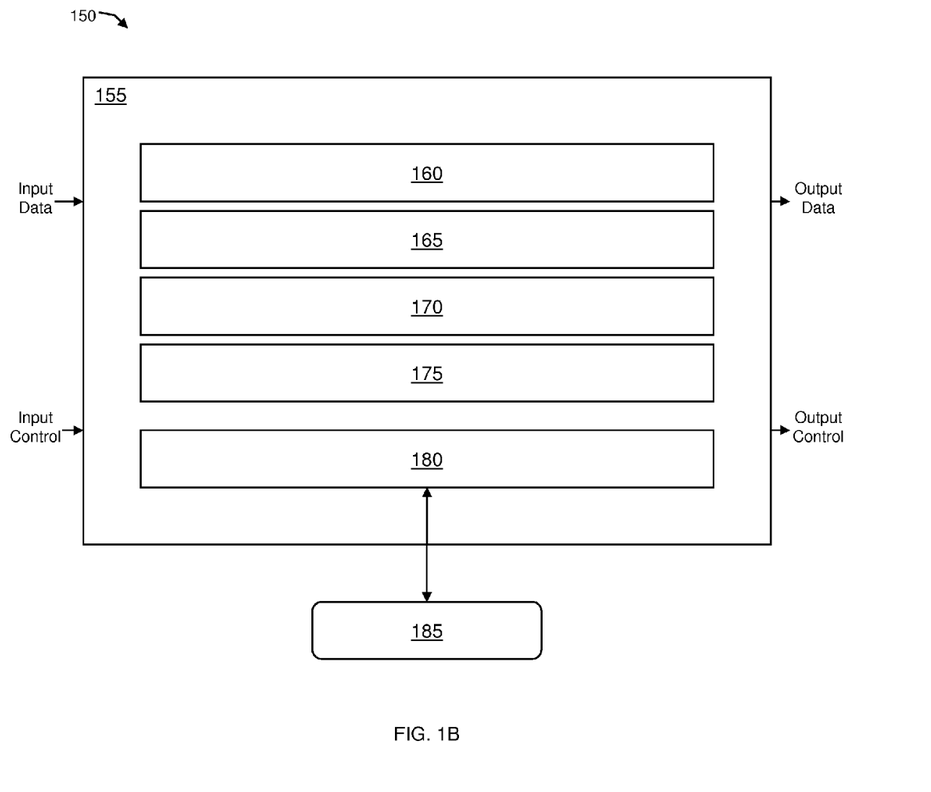
FIG. 1B is another exemplary schematic of a circuit for an AWS of a semiconductor in accordance with aspects of the invention.

FIG. 1B is another exemplary schematic of a circuit 150 for an AWS 155 of the semiconductor in accordance with aspects of the invention. The circuit 150 includes at least one critical path 160 of a semiconductor, a feedback path 165, a reference performance ring oscillator (RPRO) 170, a sensor control module 175, and a delay sensor interface 180. In embodiments, the RPRO 170, the sensor control module 175, and the delay sensor interface 180 may be implemented in a separate processor, component, and/or computer program product from the critical path 160 and the feedback path 165. The critical path 160 and the feedback path 165 may be implemented as part of an application-specific integrated circuit on the target semiconductor product.

For example, as will be appreciated by one skilled in the art, aspects of the present invention may be embodied as a circuit, a method, or a computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a non-volatile random access memory (NV-RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages.

The critical path 160, the feedback path 165, the RPRO 170, and the sensor control module 175 perform the same functions as, respectively, the critical path 120, the feedback path 135, the RPRO 140, and the inbound and the outbound control modules 125, 130 in FIG. 1A. In particular, during normal operation, the critical path 160 receives input data from other semiconductor datapaths, other semiconductor components, and/or other semiconductors in the system, transfers the input data through the critical path 160, and outputs the input data as output data to, for example, the other semiconductor datapaths. In embodiments, the AWS 155 may receive an input control signal that indicates initiation (or termination) of a performance evaluation mode of the AWS 155. During the performance evaluation mode, the sensor control module 175 disconnects the critical path 160 from these other semiconductor datapaths and connects the critical path 160 to the feedback path 165 to form a critical path ring oscillator (CPRO). The sensor control module 175 enables the CPRO and the RPRO 170 to generate a CPRO signal and a RPRO signal, respectively. In embodiments, the delay sensor module 185, the delay sensor interface 175 and the RPRO 170 may be shared across multiple independent CPRO partitions of the critical path 160 and their respective feedback path 165.

The AWS 155 is in communication with a delay sensor module 185 via the delay sensor interface 180. The delay sensor module 185 may implemented as a separate processor, component, and/or computer program product from the AWS 155. In embodiments, the delay sensor module 185 may send control signals to the AWS 155 to initiate (or terminate) the performance evaluation mode of the AWS 155. During the performance evaluation mode, the sensor control module 175 receives the generated CPRO and RPRO signals from the CPRO and the RPRO 170, respectively, and sends these signals to the delay sensor module 185 for measurement.

The delay sensor module 185 receives the CPRO and RPRO signals and measures frequencies of these signals to determine and compensate for a degradation of an operating frequency of the critical path 160. Based on this determination, the delay sensor module 185 may also estimate eminent failure of the critical path 160, and detect a failure of the critical path 160. In embodiments, the delay sensor module 185 may generate a command and/or a recommendation for other semiconductor components to perform an action to compensate for the eminent failure and/or the failure of the critical path 160. The delay sensor module 185 may send this command and/or recommendation to the other semiconductor components in the system directly or via the AWS 155, which may send the command and/or recommendation as an output control signal.

Figure 2:
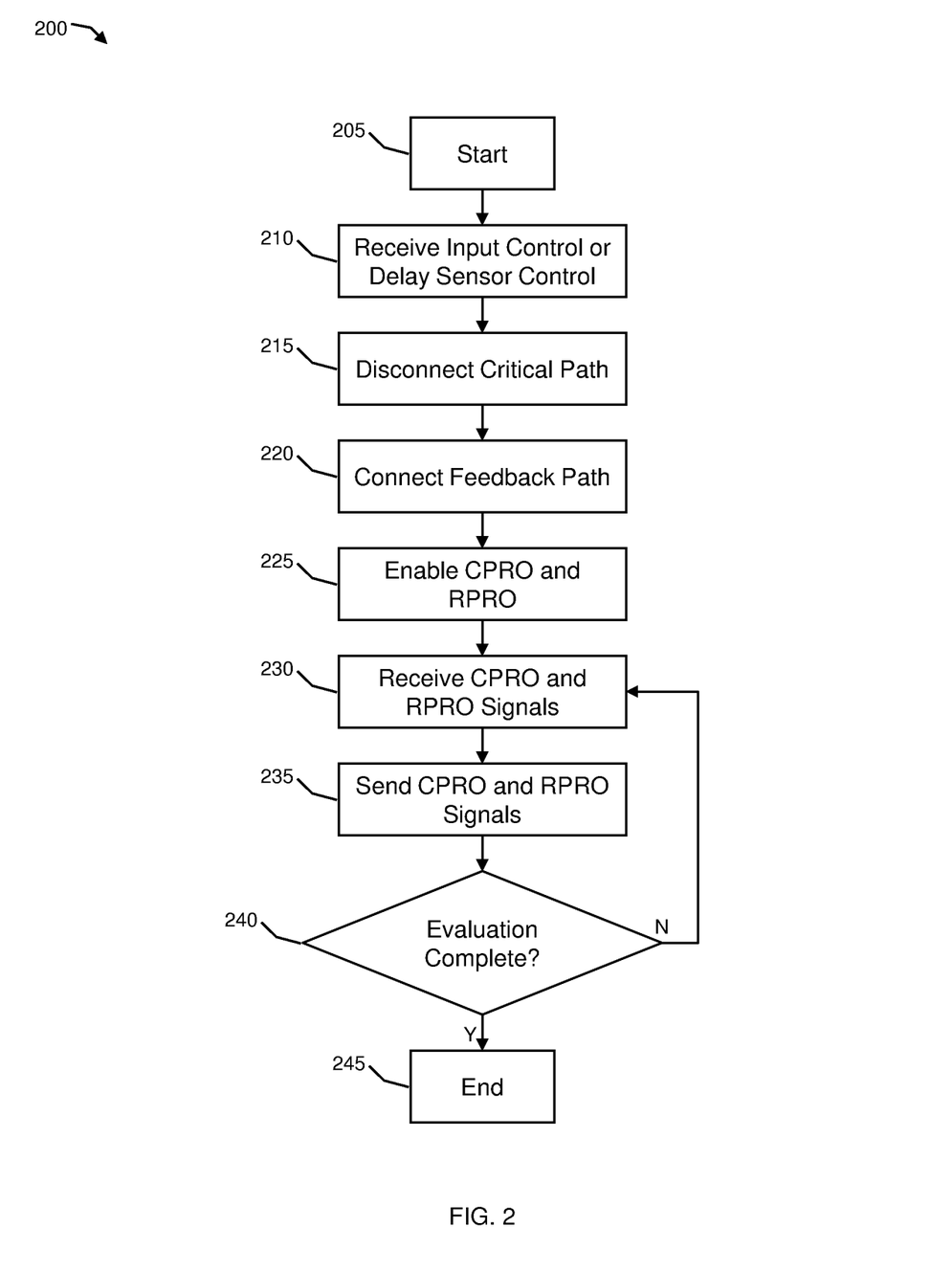
FIG. 2 is an exemplary flow diagram of a method of controlling the AWS in accordance with aspects of the invention.
Figure 3:
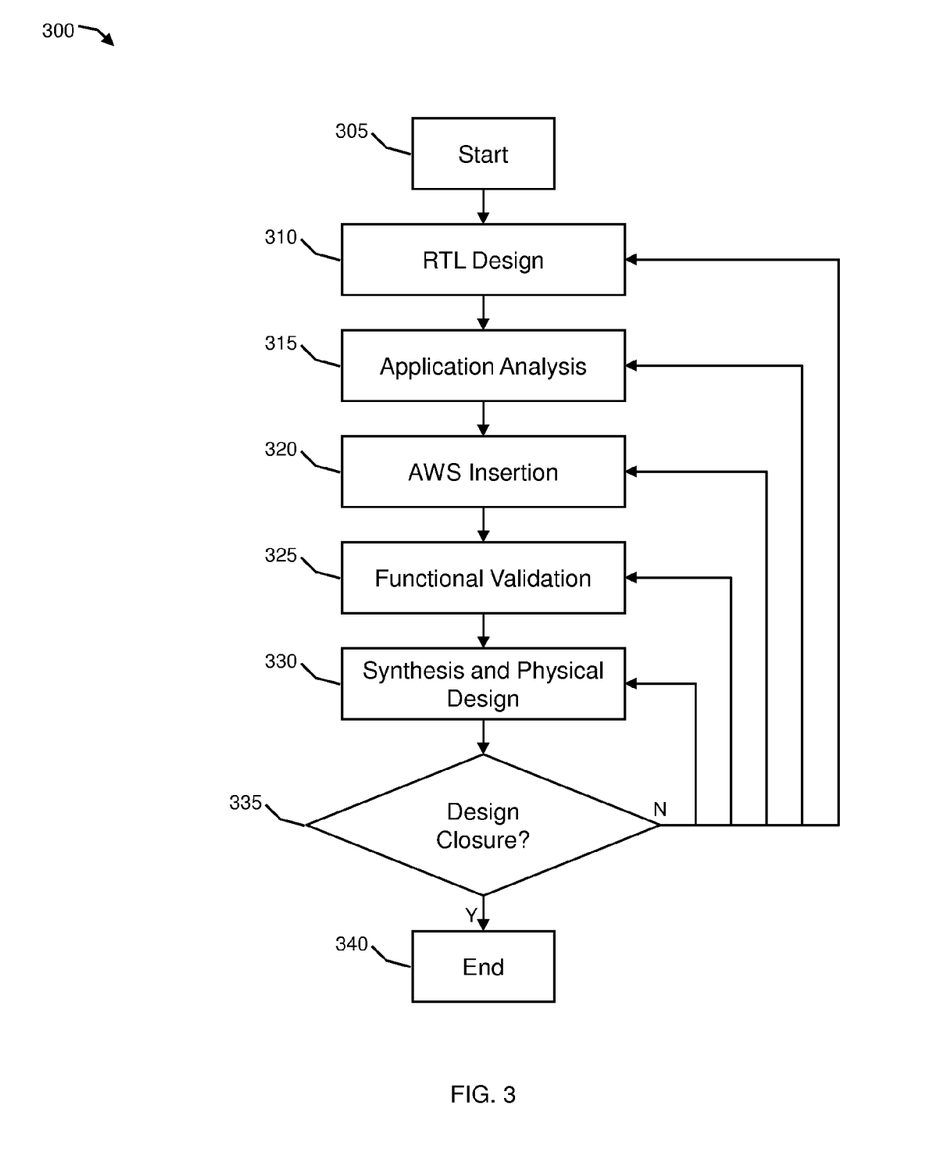
FIG. 3 is an exemplary flow diagram of a method of designing the AWS and the semiconductor in accordance with aspects of the invention.
Figure 4:
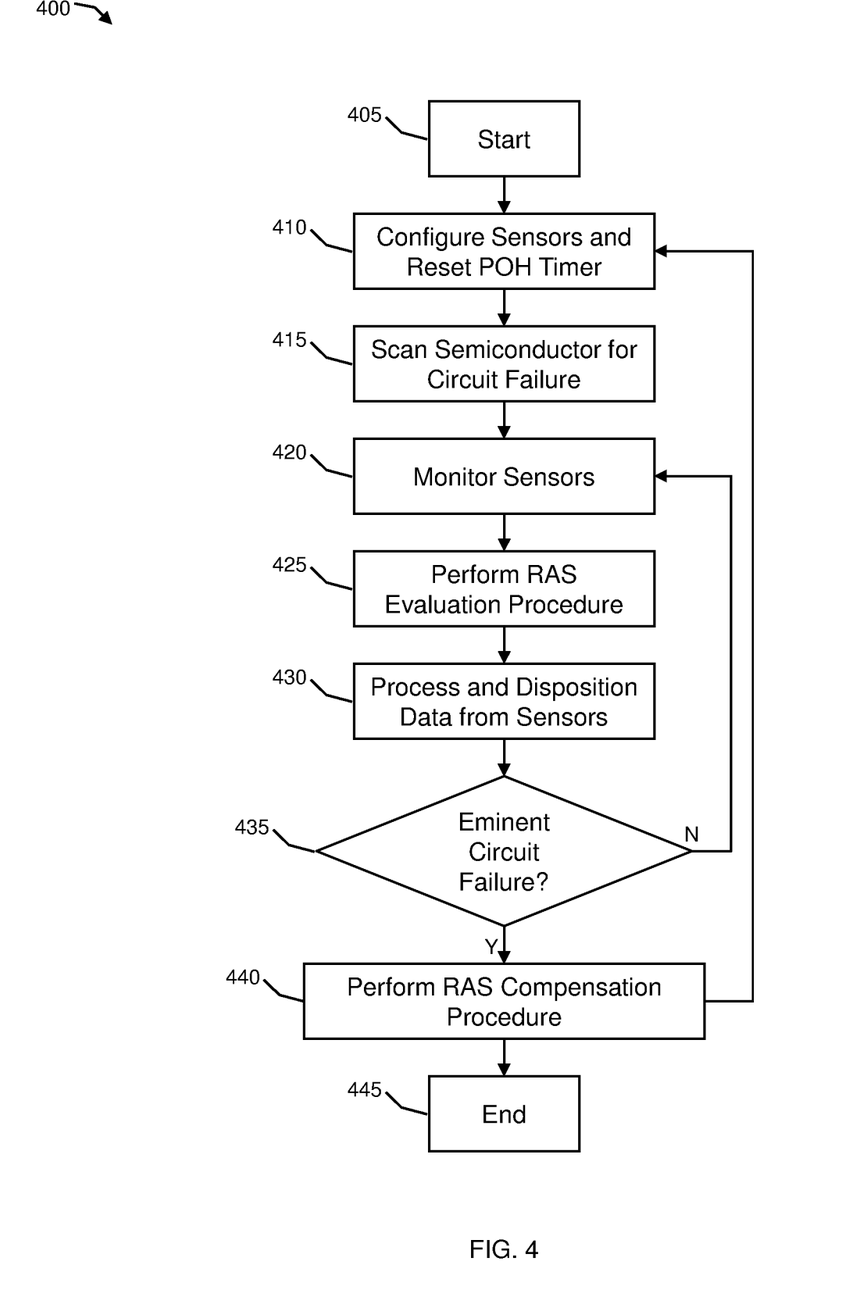
FIG. 4. is an exemplary flow diagram of a method of avoiding circuit failure and/or compensating to avoid circuit failure in a semiconductor using the AWS.

FIGS. 2-4 show exemplary flows for performing aspects of the present invention. The steps of FIGS. 2-4 may be implemented in the circuit of FIG. 1A, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 1A. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a non-volatile random access memory (NV-RAM), a read-only memory (ROM), a rigid magnetic disk and an optical disk. Current examples of optical disks include compact disk-read only memory (CD-ROM), compact disc-read/write (CD-R/W) and DVD.

FIG. 2 is an exemplary flow diagram 200 of a method of controlling an AWS (e.g., the AWS 105 in FIG. 1A) of a semiconductor in accordance with aspects of the invention. At step 205, the method starts. At step 210, inbound and/or outbound control modules (e.g., the inbound and/or the outbound control modules 125, 130) of the AWS receive an input control signal from other semiconductor datapaths and/or a control signal from a delay sensor module (e.g., the delay sensor module 145). The received input control signal and/or the delay sensor control signal initiate a performance evaluation mode of the AWS.

At step 215, the inbound and the outbound control modules disconnect a critical path (e.g., the critical path 120) from preceding and succeeding datapaths. At step 220, the inbound and the outbound control modules connect the critical path to a feedback path (e.g., the feedback path 135) to form a CPRO. At step 225, the outbound control module enables the CPRO and the RPRO (e.g., RPRO 140) via applying an initial voltage to the CPRO and the RPRO, resulting in CPRO and RPRO signals. At step 230, the inbound control module receives the CPRO and the RPRO signals from the CPRO and the RPRO, respectively.

At step 235, the inbound control module sends the CPRO and the RPRO signals to a delay sensor module (e.g., the delay sensor module 145) for measurement of frequencies of the CPRO and the RPRO signals at a specific time. At step 240, the delay sensor module 145 determines whether the evaluation performance mode is complete. For example, the evaluation performance mode may be complete when the inbound control module receives an input control signal from other semiconductor datapaths that indicate termination of the evaluation performance mode. If the evaluation performance mode is not complete, then the method returns to step 230. If the evaluation performance mode is complete, then at step 245, the method ends.

FIG. 3 is an exemplary flow diagram 300 of a method of designing an AWS (e.g., the AWS 105 in FIG. 1A) and a semiconductor in accordance with aspects of the invention. At step 305, the method starts. At step 310, a register transfer level (RTL) design of the AWS and the semiconductor is performed by a chip designer. At step 315, a design space exploration of an application of the AWS and the semiconductor is analyzed via, for example, a simulation of the AWS and/or the semiconductor using appropriate optimization algorithms. For example, at this step, a period of time of a performance evaluation mode may be determined, an amount of inverters in a feedback path (e.g., the feedback path 135) may be determined, and critical paths partitions and/or clusters (e.g., the critical path 120) may be defined.

At step 320, the AWS is inserted into a design of a semiconductor. For instance, WIR's (e.g., the WIR's 110, 115) may be inserted at ends of critical paths of the semiconductor. At step 325, the functional logic of the AWS and the semiconductor is validated. For example, it is verified that the AWS does not break the functionality of the semiconductor, and that the WIR's are transferring data to and from the critical paths properly.

At step 330, the AWS and the semiconductor are synthesized and physically designed. Specifically, the AWS and the semiconductor are mapped into physical form (e.g., implemented). At step 335, a chip designer or design system determines whether the method of designing the AWS should be closed (e.g., is complete). If not, the method returns to one of steps 310, 315, 320, 325, or 330, to make up for deficiencies during the design method. If the method of designing the AWS should be closed, at step 340, the method ends.

FIG. 4. is an exemplary flow diagram 400 of a method of avoiding circuit failure and/or compensating to avoid circuit failure in a semiconductor using an AWS (e.g., the AWS 105 in FIG. 1A). At step 405, the method starts. At step 410, a control module of the semiconductor configures sensors in the semiconductor and resets a Power-On Hours (POH) timer of the semiconductor. The POH timer measures a time, in hours, that electrical power is applied to the semiconductor. In embodiments, the POH timer may be used to calculate a mean time between failures (MTBF) of the semiconductor, or a predicted time between inherent failures of the semiconductor during operation.

At step 415, the control module scans the semiconductor for initial circuit failures resulting from, for example, negative bias temperature instability (NBTI), positive bias temperature instability (PBTI), hot carriers injection (HCI), time-dependent dielectric breakdown (TDDB), and electromigration (EM). These failures may be flagged by the sensors in the semiconductor, such as the AWS. At step 420, a control module monitors the sensors in the semiconductors, such as the AWS. In particular, within the semiconductor product, a control module may receive an output control signal from a first AWS and/or a control signal from a delay sensor module (e.g., the delay sensor module 145) from a second AWS. These control signals may, for example, indicate to the control module that a maximum operating frequency of a critical path (e.g., the critical path 120) is degraded and/or that the critical path has failed and should be compensated for. In embodiments, the sensors of the semiconductor may be independently monitored for a predetermined period of time or at a number of predetermined times per year (e.g., 12 times per year).

At step 425, the control module performs an RAS evaluation procedure. This procedure may be implemented in a software stack of an embedded processor of the semiconductor, the stack including an operating system, firmware, and applications to perform the functions of the RAS evaluation procedure. For instance, the RAS evaluation procedure may include detecting and avoid semiconductor faults and circuit failures, duplicating semiconductor components to avoid a single point of failures, throttling operating frequency, processing activities, and/or setting temperature or supply voltage. At step 430, the control module receives process and disposition data from the sensors of the semiconductor resulting from the RAS evaluation procedure, such as determine whether the data from the AWS indicates degradation of the operating frequency of the semiconductor.

At step 435, based on the RAS evaluation procedure and the disposition data from the sensors used in the procedure, the control module determines whether there is an eminent circuit failure in the semiconductor. For instance, the control module may determine that there is an eminent circuit failure in a critical path evaluated by the AWS. If there is no eminent circuit failure in the semiconductor, the method returns to step 420. If there is an eminent circuit failure, at step 440, the control module configures the semiconductor to achieve or improve RAS. For example, if there is an eminent circuit failure based on a time-dependent degradation in operating frequency of the semiconductor observed via the AWS, the control module may compensate for the eminent circuit failure in various ways. These include adjusting, for instance, a specific operating clock (e.g., frequency and/or duty cycle), temperature, and/or supply voltage of the semiconductor. Following the RAS compensation procedure, the semiconductor product is configured for lifetime monitoring. At step 445, the method ends when the system is powered down.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A circuit for measuring and compensating for time-dependent performance degradation of an integrated circuit, comprising:
at least one critical functional path of the integrated circuit;
Wearout Isolation Registers (WIR's) connected to boundaries of the critical functional path;
a feedback path connected to the WIR's; and
a sensor control module operable to:
disconnect the critical functional path from preceding and succeeding functional paths of the integrated circuit;
connect the critical functional path to the feedback path to form a critical path ring oscillator (CPRO); and
enable the CPRO to generate an operating signal,
wherein a delay sensor module is operable to measure a frequency of the operating signal to determine and compensate for a degradation of application performance over a lifetime of a semiconductor product.

2. The circuit of claim 1, further comprising a reference performance ring oscillator (RPRO) connected to the sensor control module, wherein:
the sensor control module is further operable to enable the RPRO to generate a reference signal; and
the delay sensor module is further operable to measure a technology reference frequency of the operating signal to determine and compensate for the application performance degradation of the semiconductor product.

3. The circuit of claim 2, wherein:
the frequency of the operating signal is an operating frequency of a target semiconductor technology; and
the reference frequency of the operating signal is a maximum operating frequency of a calibrated structure for the target semiconductor technology.

4. The circuit of claim 2, wherein the sensor control module is further operable to:
receive the operating signal and the reference signal from the CPRO and the RPRO, respectively; and
send the operating signal and the reference signal to the delay sensor module for measurement.

5. The circuit of claim 1, wherein the sensor control module is further operable to receive at least one of an input control signal and a delay sensor control signal that indicate at least one of initiation and termination of a performance evaluation mode.

6. The circuit of claim 1, wherein the delay sensor module is further operable to:
detect one of an eminent failure and a failure of the critical functional path based on the determination of a rate of degradation of the frequency of the operating signal; and
generate at least one of:
a recommendation to perform an action to compensate for the one of the eminent failure and the failure of the critical functional path; and
a degradation signal that indicates the degradation of the frequency of the operating signal.

7. The circuit of claim 6, wherein the sensor control module is further operable to:
receive at least one of the recommendation to perform the action to compensate for one of the eminent failure and the failure of the critical functional path, and the degradation signal that indicates the degradation of the frequency of the operating signal; and
send an output control signal including at least one of the recommendation to perform the action to compensate for one of the eminent failure and the failure of the critical functional path, and the degradation signal that indicates the degradation of the frequency of the operating signal.

8. The circuit of claim 1, wherein a semiconductor control module is operable to configure the integrated circuit based on the degradation of the frequency of the operating signal to improve reliability, availability and serviceability (RAS) of the integrated circuit.

9. A method for measuring and compensating for time-dependent application performance degradation of an integrated circuit, comprising:
disconnecting a critical functional path of the integrated circuit from preceding and succeeding functional paths of the integrated circuit;
connecting the critical functional path to a feedback path to form a critical path ring oscillator (CPRO); and
enabling the CPRO to generate an operating signal,
wherein a frequency of the operating signal is measured to determine and compensate for a degradation of the frequency of the operating signal over a lifetime of a semiconductor product.

10. The method of claim 9, further comprising generating a reference performance ring oscillator (RPRO) reference signal, wherein an initial frequency of the CPRO operating signal is measured to determine and compensate for the degradation of the frequency of the operating signal over the lifetime of the semiconductor product.

11. The method of claim 10, wherein:
the frequency of the CPRO operating signal is an operating frequency of the critical functional path; and
the initial frequency of the CPRO operating signal is a maximum operating frequency of the critical functional path.

12. The method of claim 10, further comprising:
receiving the CPRO operating signal; and
sending the CPRO operating signal and the reference RPRO signal for measurement.

13. The method of claim 9, further comprising receiving at least one of an input control signal and a delay sensor control signal that indicate at least one of initiation and termination of a performance evaluation mode.

14. The method of claim 9, wherein one of an eminent failure and a failure of the critical functional path is detected based on the determination of the degradation of the frequency of the CPRO operating signal.

15. The method of claim 14, further comprising:
receiving at least one of a recommendation to perform an action to compensate for one of the eminent failure and the failure of the critical functional path, and a degradation signal that indicates the degradation of the frequency of the operating signal; and
sending an output control signal including at least one of the recommendation to perform the action to compensate for one of the eminent failure and the failure of the critical functional path, and the degradation signal that indicates the degradation of the frequency of the operating signal.

16. The method of claim 9, wherein the integrated circuit is configured based on the degradation of the frequency of the operating signal to improve reliability, availability and serviceability (RAS) of the integrated circuit.

17. A computer program product comprising a non-transitory computer readable storage medium, having readable program code embodied in the non-transitory storage medium, the computer program product includes at least one component operable to:
  disconnect a critical functional path from preceding and succeeding functional paths of the integrated circuit;
  connect the critical functional path to a feedback path to form a critical path ring oscillator (CPRO);
  enable the CPRO to generate an operating signal;
  generate a reference performance ring oscillator (RPRO) signal;
  receive the CPRO operating signal; and
  send the CPRO operating signal and the RPRO signal for measurement,
  wherein a frequency of the CPRO operating signal and an initial frequency of the CPRO operating signal are measured to determine and compensate for a time-dependent degradation of the frequency of the CPRO operating signal.

18. The computer program product of claim 17, wherein:
  the frequency of the CPRO operating signal is an operating frequency of the critical functional path; and
  the initial frequency of the CPRO operating signal is a maximum operating frequency of the critical functional path.

19. The computer program product of claim 18, wherein the at least one component is further operable to receive at least one of an input control signal and a delay sensor control signal that indicate at least one of initiation and termination of a performance evaluation mode.

20. The computer program product of claim 19, wherein the integrated circuit is configured based on the time-dependent degradation of the frequency of the CPRO operating signal to improve reliability, availability and serviceability (RAS) over a lifetime of the integrated circuit.

21. The circuit of claim 1, wherein:
  the preceding functional paths comprise at least one of preceding semiconductor data paths, preceding semiconductor components, and preceding semiconductors;
  the succeeding functional paths comprise at least one of succeeding semiconductor data paths, succeeding semiconductor components, and succeeding semiconductors;
  the critical functional path during a normal operation receives input data from the at least one of the preceding semiconductor data paths, the preceding semiconductor components, and the preceding semiconductors, and outputs the input data as output data to the at least one of the succeeding semiconductor data paths, the succeeding semiconductor components, and the succeeding semiconductors; and
  the disconnecting and the connecting the critical functional path is performed during a performance evaluation operation such that the critical functional path is disconnected from the at least one of the preceding semiconductor data paths, the preceding semiconductor components, and the preceding semiconductors and connected to the feedback path, and the critical functional path is disconnected from the at least one of the succeeding semiconductor data paths, the succeeding semiconductor components, and the succeeding semiconductors and connected to the feedback path.

\* \* \* \* \*